(12) United States Patent
Furukawa et al.

(10) Patent No.: US 6,686,570 B2
(45) Date of Patent: Feb. 3, 2004

(54) HOT PLATE UNIT

(75) Inventors: Masakazu Furukawa, Gifu (JP); Yasutaka Ito, Gifu (JP); Jo Saito, Gifu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/958,689

(22) PCT Filed: Dec. 19, 2000

(86) PCT No.: PCT/JP00/08988

§ 371 (c)(1),
(2), (4) Date: Oct. 10, 2001

(87) PCT Pub. No.: WO01/59816

PCT Pub. Date: Aug. 16, 2001

(65) Prior Publication Data

US 2002/0134776 A1 Sep. 26, 2002

(30) Foreign Application Priority Data

Feb. 10, 2000 (JP) .................................. 2000-033429

(51) Int. Cl.[7] ............................................. H05B 3/68
(52) U.S. Cl. ............................... 219/465.1; 219/444.1
(58) Field of Search ...................... 219/444.1, 449.1, 219/451.1, 452.11, 454.12, 455.11, 465.1, 467.1; 118/724, 725

(56) References Cited

U.S. PATENT DOCUMENTS

| 2,715,173 | A | * | 8/1955 | Faruharson ................ 126/211 |
| 4,363,956 | A | * | 12/1982 | Scheidler et al. ....... 219/452.12 |
| 5,063,031 | A | * | 11/1991 | Sato ........................... 118/725 |
| 5,490,228 | A | * | 2/1996 | Soma et al. ................ 118/50.1 |
| 5,521,790 | A | * | 5/1996 | Ruckel et al. .............. 279/128 |
| 5,532,458 | A | * | 7/1996 | Kratel et al. ............. 219/460.1 |
| 5,683,606 | A | | 11/1997 | Ushikoshi et al. .......... 219/544 |
| 6,359,264 | B1 | * | 3/2002 | Schaper et al. .......... 219/444.1 |
| 6,534,750 | B1 | * | 3/2003 | Tanoue et al. ........... 219/444.1 |

FOREIGN PATENT DOCUMENTS

| JP | 4-13837 | 10/1983 |
| JP | 62-169330 | 7/1987 |
| JP | 63-149089 | 9/1988 |
| JP | 07-130830 | 5/1995 |
| JP | 08-315965 | 11/1996 |
| JP | 09-017849 | 1/1997 |
| JP | 10-284382 | 11/1998 |

\* cited by examiner

*Primary Examiner*—Sang Paik
(74) *Attorney, Agent, or Firm*—Sheridan Ross PC

(57) ABSTRACT

A hot plate unit that cools within a short period of time without a complicated or enlarged structure. The hot plate unit (1) includes a hot plate (3), which is arranged in an opened portion (4) of a casing (2A) and has a resistor (10). The casing (2A) and the hot plate (3) form a space to enable the circulation of air. An inner bottom plate (41) is provided in the casing (2A).

7 Claims, 4 Drawing Sheets

HOT PLATE UNIT

TECHNICAL FIELD

The present invention relates to a hot plate unit, and more particularly, to a hot plate unit used to heat silicon wafers during a semiconductor manufacturing process.

BACKGROUND OF THE INVENTION

During a semiconductor manufacturing process, for example, when heating and drying a silicon wafer subsequent to the application of a photosensitive resin, a heating apparatus, which is normally referred to as a hot plate unit, is used.

For example, Japanese Examined Patent Publication No. 4-13837 describes a prior art example of such apparatus. The heating apparatus of the publication includes a hot plate, which functions as an electric heating member and is made of sintered aluminum nitride, and a resistor, which is arranged in the plate. The resistor is held between ceramic base materials, which form the hot plate. The resistor has two ends that project from the side of the hot plate and are connected to a power supply via a power line.

A silicon wafer, which is a heated subject, is placed on an upper surface of the hot plate. When the resistor is energized in this state, the silicon wafer is heated to a predetermined temperature (e.g., several hundred degrees).

When the resistor is energized for a predetermined time to dry photosensitive resin, the hot plate is first cooled to a relatively low temperature. Then, the silicon wafer is removed from the hot plate. However, a relatively long time is necessary for the cooling. This limits productivity.

Thus, for example, a cooling pipe through which a coolant flows may be arranged on the lower surface of the plate to forcibly cool the plate and shorten the cooling time. However, this not only causes the entire unit to have a complicated structure but also causes the unit to be bulky and large.

Further, air may be forced against the lower surface of the hot plate to cool the plate and shorten the cooling time. However, this may contaminate the periphery of the apparatus with moisture and dust that are included in the air.

SUMMARY OF THE INVENTION

It is an object of the present invention to provide a hot plate unit that cools within a relatively short period of time without a complicated or enlarged structure.

A perspective of the present invention proposes a hot plate unit, which is arranged in an opened portion of a casing and has a resistor. A space for enabling the circulation of fluid is formed by the casing and the hot plate and an inner bottom plate is provided in the casing.

It is preferable that an opening be formed in the inner bottom plate.

In the present inventions a fluid circulates in the space formed by the casing and the hot plate. This enables forced cooling of the hot plate and shortens the cooling time in comparison to natural cooling. Further, since cooling pipes are not required, there is no need for concern of the Structure of the entire unit becoming complicated or bulky.

DETAILED DESCRIPTION OF THE PREFERRED EMBODIMENTS

A hot plate unit 1 according to a first embodiment of the present invention will now be described with reference to FIGS. 1 and 2.

Figure 1:
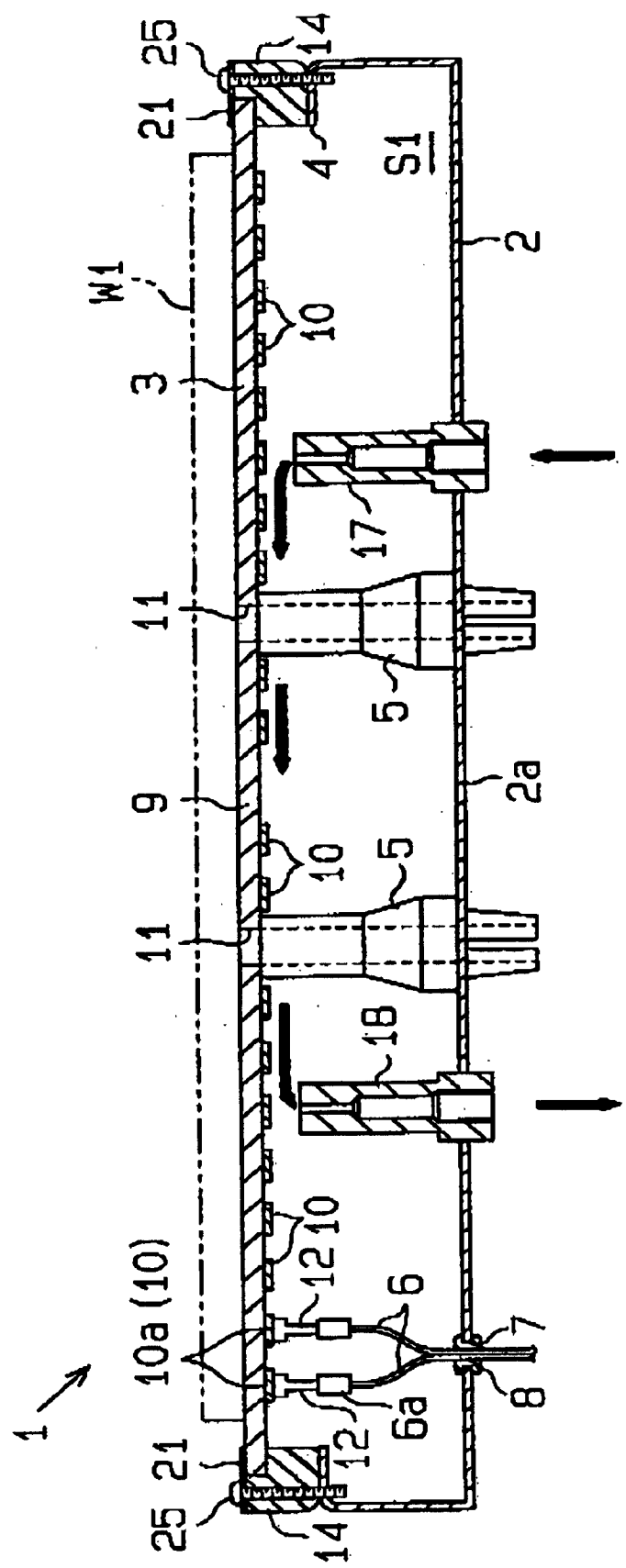
FIG. 1 is a schematic cross-sectional view showing a hot plate unit according to a first embodiment of the present invention.
Figure 2:
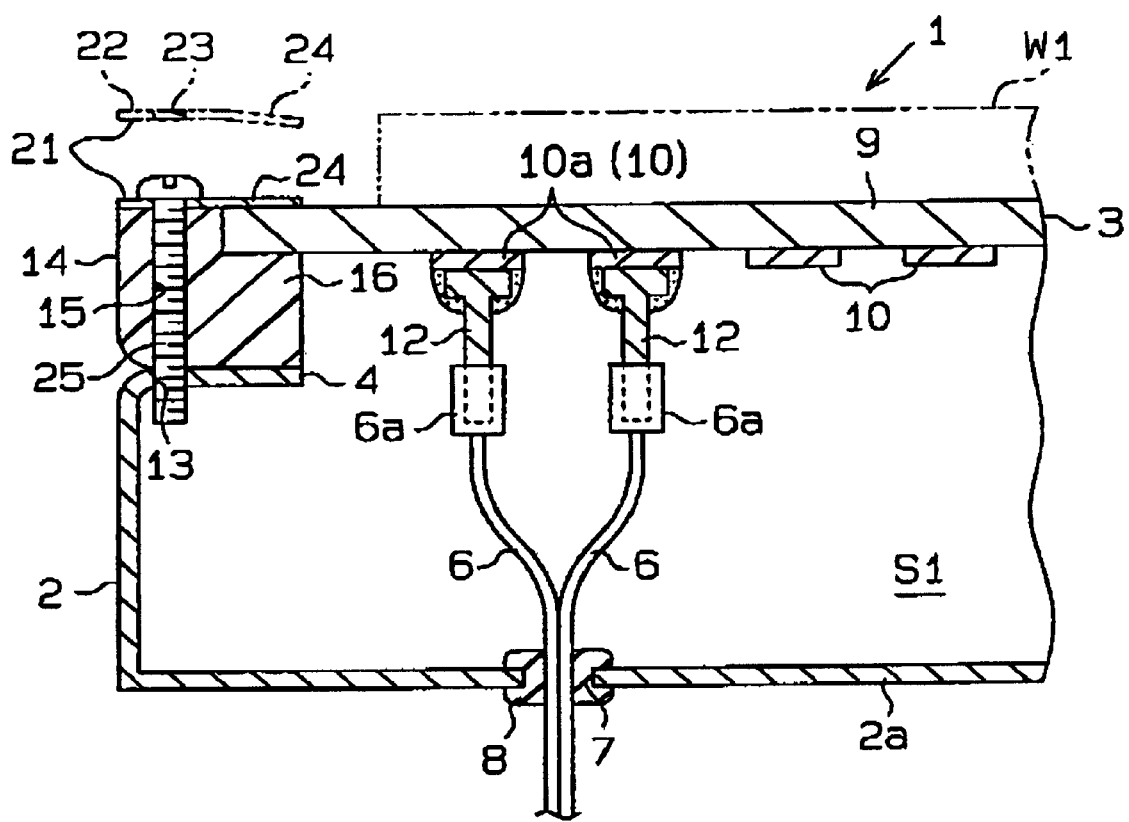
FIG. 2 is a partial enlarged cross-sectional view showing the hot plate unit according to the first embodiment of the present invention.

A hot plate unit 1, which is shown in FIGS. 1 and 2, is formed by the main elements of a casing 2 and a hot plate 3.

The casing 2 is a cup-like metal member (aluminum member) having an opened portion 4, the cross-section of which is round, located at its upper portion. Pin insertion sleeves 5, each of which receives a lift pin (not shown), are arranged near the center of a bottom portion 2a at three positions. The lift pins lifts a silicon wafer W1 in a state supporting the silicon wafer W1 at three points. A lead wire hole 7 for receiving lead wires 6, which supply current to the hot plate 3, extends through a peripheral portion of the bottom portion 2a.

The hot plate 3 is a low-temperature hot plate that heats the silicon wafer W, to which a photosensitive resin is applied, to 200 to 300° C. and dries the silicon wafer W. The hot plate 3 is formed by attaching a wiring resistor 10, which serves as a resistor, to a plate-like base material 9, which is made of a sintered ceramic. The plate-like base material 9 is arranged on the opened portion 4, and a seal ring 14, which will be described later, is arranged between the casing 2 and the base material 9. This arrangement forms a generally sealed space S1 within the inner side of the casing 2 and the lower surface of the hot plate 3.

It is preferred that the thickness of the unit 1 be 5 mm to 100 mm and particularly preferred that the thickness be 10 mm to 50 mm. This is because, if the unit 1 becomes too thick, the apparatus will be bulky. On the other hand, the hot plate 3 and the casing 2 must be thin to make the unit 1 thin. This may cause manufacturing to be difficult. Accordingly, the thickness of the unit 1 is 20 mm.

As shown in FIG. 1, the plate-like base material 9 is disk-like. The diameter of the plate-like base material 9 is slightly smaller than the external dimension of the casing 2. The wiring resistor 10 is formed in a concentric or spiral manner on the lower surface of the plate-like base material 9. Lift pin holes 11 are formed in the central portion of the hot plate 3 at positions corresponding to the sleeves.

It is preferred that nitride ceramic sinter, which has superior heat resistance and high heat conductivity characteristics, be selected as the material of the plate-like base material 9. It is preferred that the nitride ceramic sinter be a sinter formed from a metal nitride sinter, such as aluminum nitride, silicon nitride, boron nitride, and titanium nitride. Aluminum nitride sinter is especially preferred. This is because aluminum nitride sinter has the highest heat conductivity among these sinters. A sinter formed from a metal carbide ceramic, such as silicon carbide, zirconium carbide, titanium carbide, tantalum carbide, and tungsten carbide, may also be used.

The wiring resistor 10 is formed by fusing a conductive paste to the plate-like base material 9. The conductive paste includes metal particles, a metal oxide, a resin, and a solvent. Preferred metal particles that are used as the conductive paste are, for example, gold, silver, platinum, palladium, lead, tungsten, and nickel. These metals are preferred because they withstand oxidation even under high temperatures and because their resistances are such that they are easily heated when energized. Preferred metal oxides for the conductive paste are, for example, lead oxide, zinc oxide, silica, boron oxide, alumina, yttria, and titania.

Referring to FIG. 2, pads 10a, which serve as external connection terminals, are formed on the ends of the wiring resistor 10. A terminal pin 12 is soldered to each pad 10a. This electrically connects the terminal pins 12 to the wiring resistor 10. A socket 6a located on the distal end of each lead wire 6 is fitted to the distal end of each terminal pin 12. Accordingly, when current is supplied via the lead wires 6 and the terminal pins 12, the temperature of the wiring resistor 10 increases and heats the entire hot plate 3.

With reference to FIG. 2, equally spaced threaded holes 13 extend through the top rim of the opened end portion 4. The seal ring 14, which serves as a seal element, is arranged on the top rim of the opened portion 4. The seal ring 14 is annular and is substantially the same size as the opened portion 4. It is preferred that the seal ring 14 be made of an elastic material, such as resin or rubber. The seal ring 14 has a plurality of threaded holes 15 corresponding to the plurality of threaded holes 13. A stepped support 16 is formed on the inner wall of the seal ring 14 to support the lower surface of the hot plate 3 in a horizontal manner. When the hot plate 3 is supported by the stepped support 16, the top surface of the seal ring 14 is flush with the upper surface of the hot plate 3.

The seal ring 14 seals the space between the top rim of the opened portion 4 and the lower peripheral surface of the hot plate 3. This hinders the flow of air through the space.

Referring to FIGS. 1 and 2, a holding ring 21 is fixed to the upper surface of the seal ring 14 by bolts 25. The holding ring 21 includes an annular body 22, a plurality of threaded holes 23, and a plurality of holding tabs 24. The holding tabs 24 press the hot plate 3, which rests on the stepped support 16, in the vertical direction to clamp the seal ring 14, Referring to FIG. 1, a fluid supply port 17 and a fluid discharge port 18 are each attached to the bottom portion 2a by a bolt or the like. The ports 17, 18 are spaced apart from each other. The ports 17, 18 have passages extending between their inner and outer ends. Thus, the interior and exterior of the casing 2 are connected through the passages.

A female thread is formed in the inner surface of the outer end of the fluid supply port 17 about the opening to detachably receive one end of a fluid supply pipe (not shown). The other end of the pipe is connected to a fluid supply pump. Thus, air is supplied through the pipe as a cooling fluid. Further, a female thread is also formed in the inner surface of the outer end side of the fluid discharge port 18 about the opening to detachably receive one end of a fluid discharge pipe (not shown). The air in the casing 2 is discharged externally through the pipe,. The other end of the pipe opens at a location relatively distant from the apparatus.

Referring to FIG. 2, a seal packing 8, which serves as a seal structure, is fitted into the lead wire hole 7. The seal packing 8 is an annular elastic body made of rubber or the like. Each lead wire 6 is inserted through a through hole of the seal packing 8 and extended out of the casing 2. The seal packing 8 seals the space between each lead wire 6 and the lead wire hole 7 and functions to prevent air from flowing through the space between the lead wires 6 and the lead line hole 7.

The procedure for using the hot plate unit 1 will now be discussed.

A silicon wafer W1, to which a photosensitive resin has been applied, is placed on the hot plate 3. In this state, the wiring resistor 10 is energized. The contact between the heated hot plate 3 and the silicon wafer W1 gradually increases the temperature of the silicon wafer W1. The heating continues for a predetermined time. After the photosensitive resin is sufficiently dried, the wiring resistor 10 is de-energized.

Then, the gas pump is driven to supply the sealed space S1 with cooling air through the fluid supply port 17. The air drawn through the fluid supply port 17 contacts the lower surface of the hot plate 3 in the sealed space S1 as it flows toward the fluid discharge port 18. During this period, the air is heated by the heat of the hot plate 3. After being heated, the air flows out of the space through fluid discharge port 18 and is released to a separate space where there is no worry of contamination. The bold arrows of FIG. 1 schematically show the flow of the cooling air. When the hot plate 3 is cooled to a relatively low temperature, the silicon wafer W1 is removed from the hot plate 3.

The first embodiment has the advantages described below.

(1) The generally sealed space S1 is formed between the casing 2 and the hot plate 3 in the hot plate unit 1. Although projecting objects such as the terminal pins 12 are provided on the lower surface of the hot plate 3, they are arranged in the space S1 between the casing 2 and the hot plate 3. That is, the projecting objects are not exposed externally from the apparatus and are in a substantially protected state. Accordingly, the bottom surface of the casing 2 is attached to a support stage, which is not shown, without any interference with the projecting objects.

(2) The space S1 formed between the casing 2 and the hot plate 3 is generally sealed and enables air to circulate therein. Thus, the circulation of air in the space S1 cools the hot plate 3 and shortens the cooling time in comparison to natural cooling. Accordingly, the usage of the hot plate unit 1 shortens the time required for the drying process and increases productivity.

Since the space S1 is in a generally sealed state, air hardly leaks out of the apparatus and thus there is no need for concern about contamination of the surrounding environment. Accordingly, the first embodiment provides a clean unit 1.

Further, this structure does not require the installation of cooling pipes or the like. Thus, there is no need for concern about the structure of the unit 1 becoming complicated or bulky and large.

(3) In the first embodiment, the casing 2 is provided with the fluid supply port 17 and the fluid discharge port 18, which connect the interior and exterior of the casing 2. Accordingly, air is efficiently circulated in the sealed space S1 through the two ports 17, 18, This forcibly cools the hot plate 3 and returns the hot plate 3 to a relatively low temperature within a short period of time.

(4) In the hot plate unit 1, the seal ring 14 is arranged between the top rim of the opened portion 4 in the casing 2 and the periphery of the lower surface of the hot plate 3 to seal this portion. Thus, air is prevented from leaking out of the apparatus through the space between the casing 2 and the hot plate 3 and a high level of sealing is guaranteed for the space S1. This helps to prevent the contamination of the surrounding environment, which may be caused by air discharge.

(5) In the hot plate unit 1, the lead wire hole 7 is provided in the bottom portion 2a and the lead wire 7 is inserted through its through hole. Accordingly, the leakage of air out of the apparatus through the lead wire hole 7 is prevented and a high level sealing of the space 31 is maintained. This helps to prevent the contamination of the surrounding environment, which may be caused by air discharge.

(6) In the first embodiment, the thickness of the unit 1 is maintained in an optimal range of 10 mm to 100 mm. This avoids difficulties during production and avoids enlargement of the apparatus.

Figure 3:
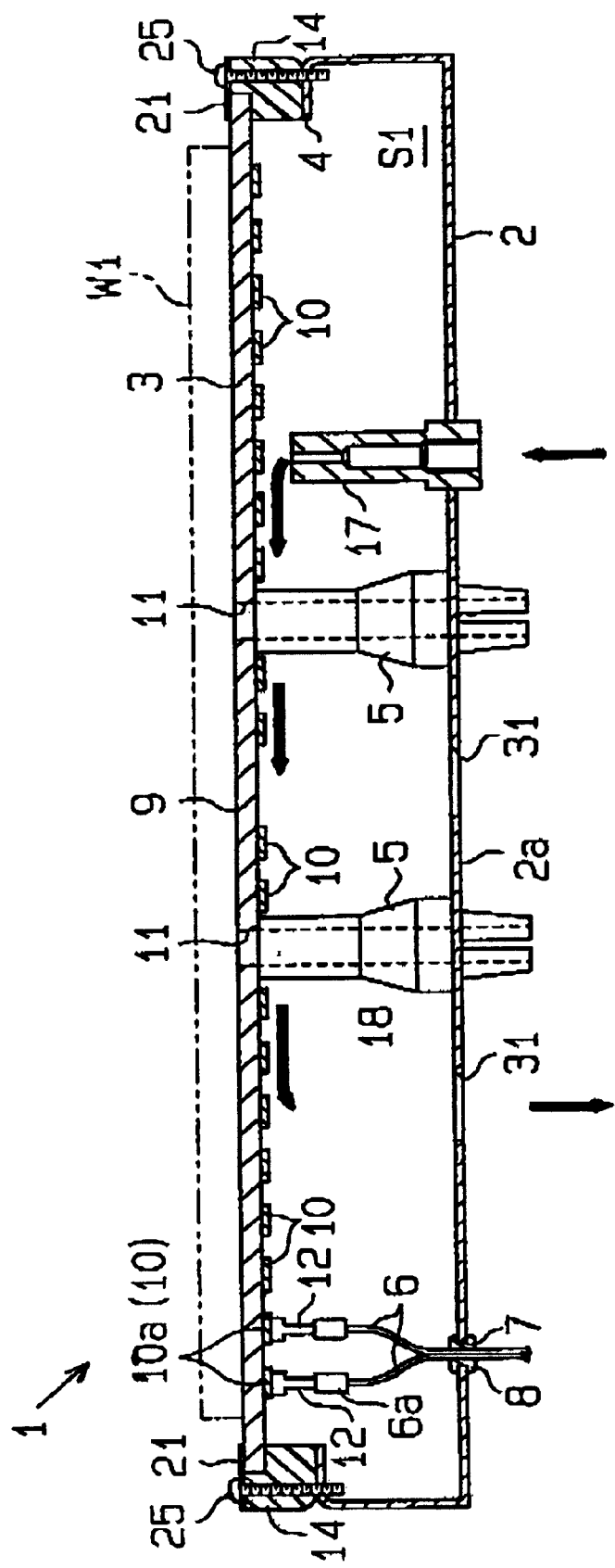
FIG. 3 is a schematic cross-sectional view showing a hot plate unit according to a second embodiment of the present invention.

FIG. 3 is a schematic cross-sectional view showing a hot plate unit 1 according to a second embodiment of the present invention. In the second embodiment, the fluid discharge port 18 is eliminated from the casing 2 and only a ventilation hole 31 is provided. In other words, the interior of the unit 1 does not have to be in a generally sealed state like in the first embodiment (i.e., the space may be in an opened state) This structure decreases the number of parts and simplifies the structure of the unit 1.

Figure 4:
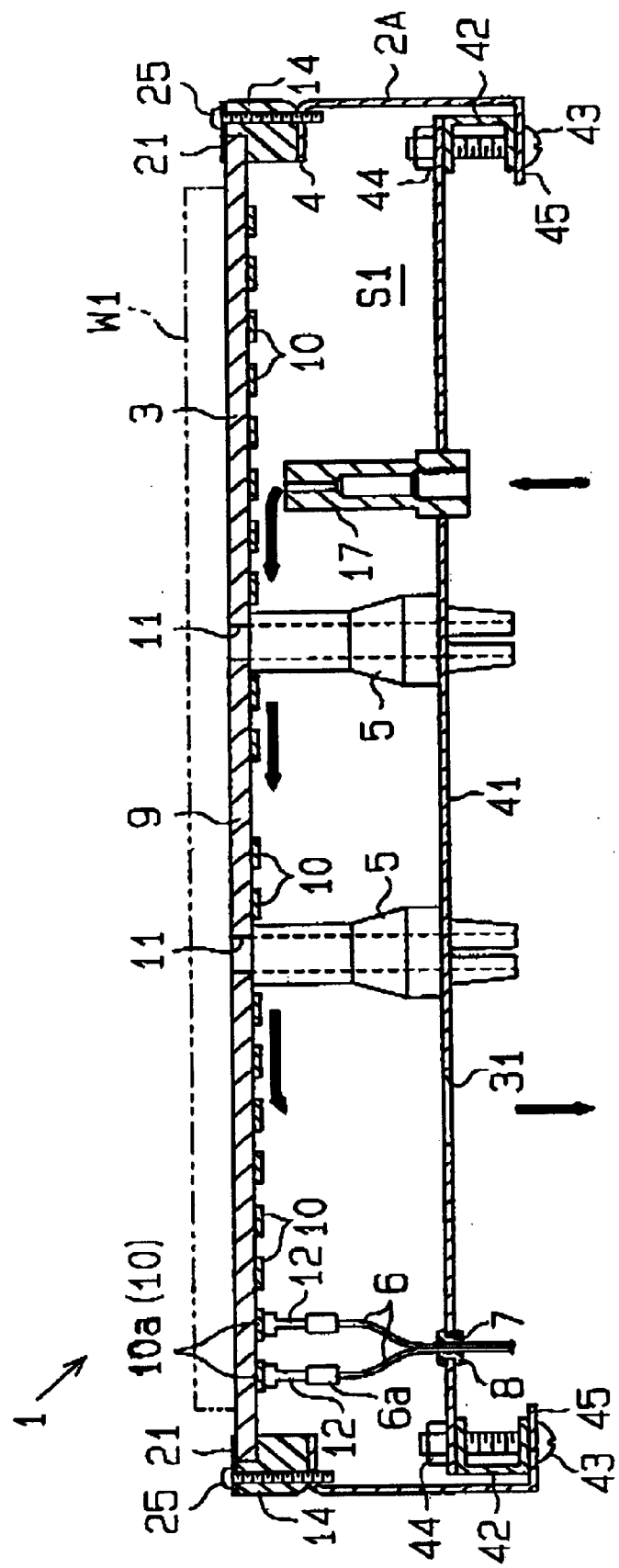
FIG. 4 is a schematic cross-sectional view showing a hot plate unit according to a third embodiment of the present invention.

FIG. 4 is a schematic cross-sectional view showing a hot plate unit 1 according to a third embodiment of the present invention. Casing 2A is a metal member (aluminum member) and does not have a bottom portion. An opened portion 4 having a round cross-section is formed on the upper portion of the casing 2A. An inner bottom plate 41, which is made from metal, is arranged in the casing 2A. The inner bottom plate 41 may also be formed from a material other than metal (e.g., ceramic). Further, as shown in FIG. 4, a ventilation hole 31 is preferably formed in the inner bottom plate 41, In a state supported by metal supporters 42, which are generally C-shaped, the inner bottom plate 41 is fixed to the upper surface of a fixing portion 45 of the casing 2A. Thus, in the third embodiment, the space S1 formed in the casing 2A is not sealed. Accordingly, air is permitted to escape outside through the gap between the casing 2A and the inner bottom plate 41. An opening may be formed in the inner bottom plate 41.

As shown in FIG. 4, a fluid supply port 17 is attached to the inner bottom plate 41 using, for example, bolts. The port 17 includes a flow passage that opens at the inner end surface and the outer end surface. Thus, the inner and outer side of the casing 2A is connected by the flow passage.

An example of a procedure for manufacturing the hot plate 3 in the third embodiment will now be discussed.

(1) 100 parts by weight of aluminum nitride particles (manufactured by Tokuyama, average grain diameter 1.1 $\mu$m), 4 parts by weight of yttrium oxide ($Y_2O_3$: yttria, average grain diameter 0.4 $\mu$m), and 12 parts by weight of an acrylic resin binder (SA-545 manufactured by Mitsui Kagaku, acid value 0.5) were mixed and put into a mold to form a molded product.

(2) The molded product was heated to 350° C. for four hours under a nitrogen atmosphere to thermally decompose the acrylic resin binder.

(3) The molded product was hot pressed for three hours under the condition of 1890° C. and a pressure of 150 kg/cm$^2$ to produce an aluminum nitride sinter.

(4) A conductive paste was screen printed on the bottom surface of the sinter, which was produced in the above (3). The printing pattern is a concentric pattern. Sorubesuto PS603D, which is manufactured by Tokuriki Kagaku Kenkyujo and which is used to form through holes in printed circuit boards, was used as the conductive paste. The conductive paste is a silver lead paste and includes 7.5 parts by weight of metal oxide formed from lead oxide (5 weight %), zinc oxide (55 weight %), silica (10 weight %), boron oxide (25 weight %), and alumina (5 weight %) with respect to 100 parts be weight of silver.

(5) Then, the sinter to which the conductive paste was printed was heated to 780° and baked, and the silver and lead in the conductive paste was sintered and fused to the sinter to form a heated body. The heated body of silver and lead had a thickness of 5 $\mu$m, a width of 2.4 mm, and an area resistance of 7.7 $\Omega/\square$.

(6) The sinter produced in the above (4) was immersed in an electroless nickel plating bath containing an aqueous solution that includes 80 g/l of nickel sulfate, 24 g/l of sodium hypophosphite, 12 g/l of sodium acetate, 8 g/l of boron acid, 6 g/l of ammonium chloride, and a metal coating layer (nickel layer) having a thickness of 1 $\mu$m was deposited on the surface of the heated body of tin and lead (9/1) to form the wiring resistor 10.

(7) A silver lead soldering paste (manufactured by Tanaka Kikinzoku) was screen printed on a portion in which a terminal connected to a power supply is attached to form a soldering layer. Then, the terminal pin 12, which is made of Kovar, was placed on the soldering layer and heat reflow was performed at 300° C. to connect the terminal pin 12 to the heated body connection pad 10a.

(8) A thermocouple for controlling temperature is inserted in a hole, which bottom was closed, polyimide resin was charged in the hole, and hardening was performed for two hours at 190° C. to produce the hot plate 3. The hot plate 3 was installed in the unit of FIG. 4. The seal ring 14 was made of fluoroplastic. After heating the unit 1 to 140° C., the cooling time required to fall to 90° C. was measured. The time was three minutes.

Further, the hot plate 3 was manufactured through procedures (1) to (8). The hot plate. 3 was contacted with an aluminum plate having an air flow passage therein. This was used as a comparative example. After heating the comparative example to a temperature of 140° C., the cooling time required for the temperature to fall to 90° C. was measured. The time was eight minutes. In other words, cooling took two times or longer than in the preferred embodiment.

Accordingly, the third embodiment has the advantages described below.

(1) Air is permitted to flow in the sealed space S1 formed between the casing 2 and the hot plate 3. Thus, the flow of forced air in the space S1 cools the hot plate 3 and shortens the cooling time in comparison to cooling through heat radiation. Accordingly, the usage of the hot plate unit 1 shortens the time required for each drying process and increases productivity. Further, this structure does not require the installation of cooling pipes. Thus, there is no need for concern about the structure of the entire unit 1 becoming complicated or bulky.

(2) In the third embodiment, the casing 2 is provided with the fluid supply port 17, which connects the interior and exterior of the casing 2. Accordingly, air is efficiently circulated in the space S1 through the port 17. This cools the hot plate 3 with forced air and returns the hot plate 3 to a relatively low temperature within a short period of time.

(3) In the hot plate unit 1, the seal ring 14 is arranged between the top rim of the opened portion 4 in the casing 2 and the periphery of the lower surface of the hot plate 3. Thus, the gap in this portion is sealed.

(4) The inner bottom plate 41 is arranged in the casing 2A in the hot plate unit 1. Accordingly, the pin insertion sleeves 5 and the fluid supply port 17 may be supported in the inner bottom plate 41 even if the bottom of the casing 2A is largely opened.

Further, in the third embodiment, the inner bottom plate 41 is fixed to the upper surface of the fixing portion of the casing 2A by the metal supporters 42, the bolts 43, and the nuts 44. In other words, the inner bottom plate 41 is fixed at a position slightly higher than the bottom surface of the casing 2A. Thus, a certain amount of space is provided between the bottom surface of the inner bottom plate 41 and the support stage. Accordingly, there are no projecting objects on the lower surface of the casing 2A even if the pin insertion sleeves 5 and the fluid supply port 17 are attached to the bottom surface of the inner bottom plate 41. Thus, installation on the support stage is not difficult, and installation on the support stage is facilitated.

Further, the inner bottom plate 41 is detachable relative to the casing 2A. This facilitates specification changes by replacing the inner bottom plate 41 when necessary.

Additionally, a ventilation hole 31, which serves as an opening, is provided in the inner bottom plate 41. Thus, in comparison to when the ventilation hole 31 is not provided, such structure enables air to easily be discharged from the casing 2A. Accordingly, this structure further shortens the cooling time.

(5) In the third embodiment, the thickness of the unit 1 is set within the optimal range. This avoids difficulties during manufacturing and prevents the apparatus from being enlarged.

The present invention may be modified as described below.

If a certain degree of sealing is guaranteed, the seal ring 14 may be deleted. In this case, the holding ring 21 may be directly fastened to the upper surface at the opened portion 4 of the casing 2 or 2A by bolts, and the hot plate 3 may be engaged with the opened portion 4 in this state. That is, the hot plate 3 may be directly fastened to the casing 2 or 2A.

The lead wire hole 7, which serves as a wire extending portion, may be arranged in a location other than the bottom portion 2a of the casing 2 such as the side walls of the casing 2 or 2A. In the same manner, the ports 17, 18 may be arranged in the side walls of the casings 2 or 2A. The number of the lead wire hole 7 and the ports 17, 18 may of course be increased or decreased when necessary.

A gas other then air, for example, an inert gas such as carbonic acid gas or nitrogen may be circulated as the cooling fluid in the sealed space S1 defined in the casing 2 or 2A. Further, a liquid may also be circulated as the cooling fluid as long as it does not affect the electric structure in an undesirable manner.

A thermocouple may be embedded in the plate-like base material 9, which forms the hot plate 3, when necessary. This is to control temperature by measuring the temperature of the hot plate 3 with the thermocouple and changing the voltage value and the current value based on the data. In this case, a lead wire of the thermocouple is extended out of the casing through the seal packing 8.

What is claimed is:

1. A hot plate unit used to heat a wafer comprising:

a casing having an opened portion, a hot plate arranged in the opened portion and having a resistor, wherein the casing and the hot plate form a space for enabling the circulation of fluid; and an inner bottom plate provided in the casing, wherein the inner bottom plate has an opening formed therein and is located at a position higher than a bottom portion of the casing.

2. The hot plate unit according to claim 1, wherein the fluid is air.

3. The hot plate unit according to claim 1, wherein the inner bottom plate is detachably fixed to the casing.

4. The hot plate unit according to claim 1, wherein the hot plate includes a late-like base material and a resistor attached to the plate-like base material.

5. The hot plate unit according to claim 1, wherein the hot plate is made of a sintered ceramic.

6. The hot plate unit according to claim 1, wherein the hot plate includes a plate-like base material and a resistor attached to a surface of the plate-like base material.

7. The hot plate unit according to claim 1, wherein the hot plate unit is made of carbide ceramic or nitride ceramic.

* * * * *